(12) United States Patent
Koga

(10) Patent No.: US 6,515,563 B2
(45) Date of Patent: Feb. 4, 2003

(54) PRINT BOARD AND ELECTRONIC DEVICE EQUIPPED WITH THE PRINT BOARD

(75) Inventor: Yuuichi Koga, Hachioji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/892,869

(22) Filed: Jun. 28, 2001

(65) Prior Publication Data

US 2002/0057144 A1 May 16, 2002

(30) Foreign Application Priority Data

Jun. 29, 2000 (JP) ........................................ 2000-197105

(51) Int. Cl.$^7$ ................................................ H01P 3/08
(52) U.S. Cl. ........................................ 333/260; 333/246
(58) Field of Search .................... 174/52.4; 333/260, 333/246

(56) References Cited

U.S. PATENT DOCUMENTS 5,355,105 A * 10/1994 Angelucci, Sr. ............ 156/182
5,629,839 A    5/1997 Woychik ..................... 361/803

* cited by examiner

*Primary Examiner*—Benny Lee
*Assistant Examiner*—Wesley Harris
(74) *Attorney, Agent, or Firm*—Finnegan, Henderson, Farabow, Garrett & Dunner, L.L.P.

(57) ABSTRACT

A print board comprises a ground layer, an insulation layer, a signal layer formed on the insulation layer, formed in a predetermined line pattern, and serving as a transmission line for transmitting high-speed signals, and a pad formed on the signal layer. The signal layer has a line width that satisfies a characteristic impedance required for the transmission line, and the width of the signal layer is set substantially equal to the width of the pad.

16 Claims, 3 Drawing Sheets

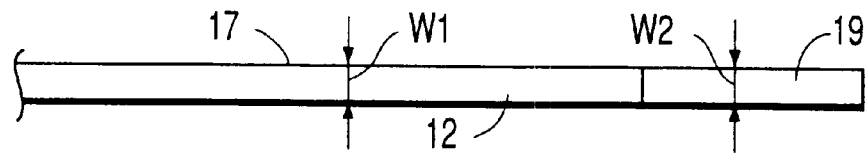
FIG. 3
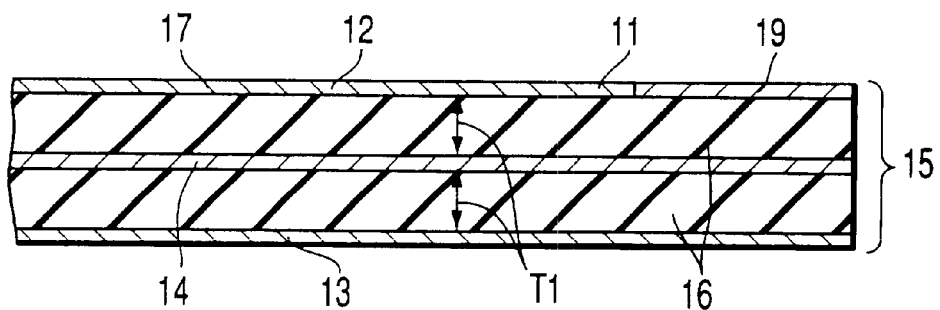
FIG. 4
| LINE WIDTH DIFFERENCE | IMPEDANCE MATCHING |
|---|---|
| 0% | ○ |
| 1 | ○ |
| 2 | ○ |
| 3 | ○ |
| 4 | ○ |
| 5 | ○ |
| 6 | △ |
| 7 | △ |
| 8 | △ |
| 9 | △ |
| 10 | × |
| 11~ | × |
FIG. 5

PRINT BOARD AND ELECTRONIC DEVICE EQUIPPED WITH THE PRINT BOARD

CROSS-REFERENCE TO RELATED APPLICATIONS

This application is based upon and claims the benefit of priority from the prior Japanese Patent Application No. 2000-197105, filed Jun. 29, 2000, the entire contents of which are incorporated herein by reference.

BACKGROUND OF THE INVENTION

1. Field of the Invention

The present invention relates to a print board having a signal layer serving as a transmission line for high-speed signals, and an electronic device such as a portable computer equipped with the print board.

2. Description of the Related Art

A multi-layer print board to cope with increases in the speed of signal transmission is widely used in a circuit system, such as a Rambus memory, for processing high-speed signals in the 1 GHz band.

A print board, in which a signal layer and a ground layer both as a surface layer are layered with an insulation layer interposed therebetween, is known as that of the abovementioned type. This signal layer is formed in a predetermined line pattern and functions as a transmission line for transmitting high-speed signals. In such conventional print boards, the thickness of the insulation layer isolating the signal layer from the ground layer, and the line width of the signal layer are set so as to keep the characteristic impedance of the signal layer (transmission line) on the ground layer at a desired value.

The signal layer of the print board has pads provided on terminal points and/or middle portions of the transmission line for soldering thereto various types of circuit components such as a semiconductor package or a connector. The size of the pads on the transmission line is determined in light of the conditions for soldering such a circuit component or manufacturing the pads. Accordingly, there may be a difference between the width of the pads and the line width of the signal layer.

If, in particular, the pads are wider than the line width of the transmission line, the continuity of the impedance of the signal layer is interrupted at the boundary of the transmission line and each pad, with the result that variations in the impedance become conspicuous when a high-speed signal passes through the boundary. These impedance variations adversely affect signal transmission on the transmission line, thereby degrading the transmission quality.

BRIEF SUMMARY OF THE INVENTION

Accordingly, the present invention is directed to method and apparatus that substantially obviates one or more of the problems due to limitations and disadvantages of the related art.

In accordance with the purpose of the invention, as embodied and broadly described, the invention is directed to a print board comprising a signal layer formed in a predetermined line pattern to serve as a transmission line for transmitting high-speed signals; and an electrical connector formed on the signal layer, connected to the transmission line, and having a width which is substantially equal to a width of the transmission line.

According to the present invention, it is possible to prevent variations in the impedance of the transmission line to thereby improve the quality of transmission.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the present invention and, together with the general description given above and the detailed description of the embodiments given below, serve to explain the principles of the present invention in which:

FIG. 3 is a plan view showing the relationship between the line width of a signal layer and the width of a pad;

FIG. 4 is a sectional view of a multi-layer print board;

FIG. 5 is a view showing an allowable range for impedance matching based on the difference between the line width of the signal layer and the pad width;

DETAILED DESCRIPTION OF THE INVENTION

An embodiment of a print board according to the present invention will now be described with reference to the accompanying drawings.

First Embodiment

Figure 1:
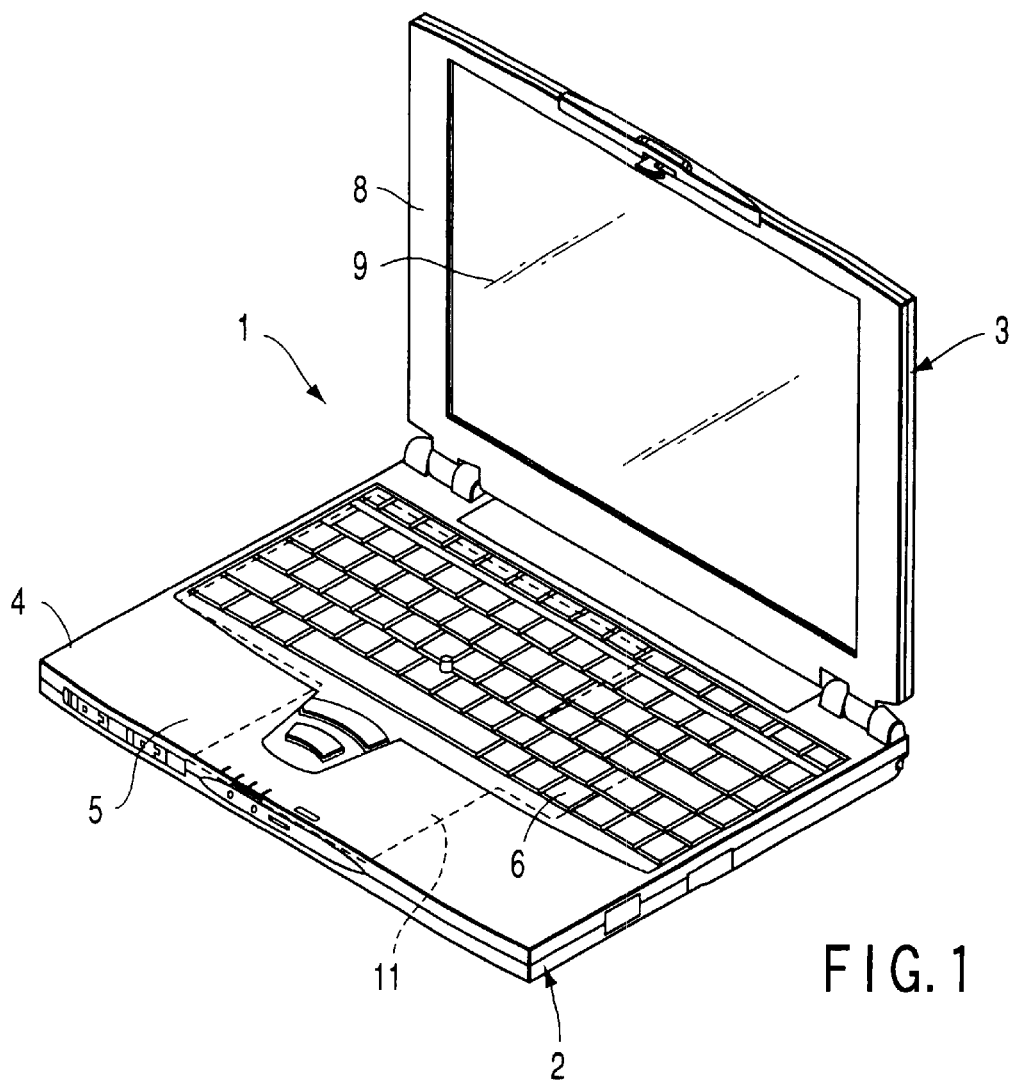
FIG. 1 a perspective view illustrating a portable computer according to a first embodiment of the invention.
Figure 2:
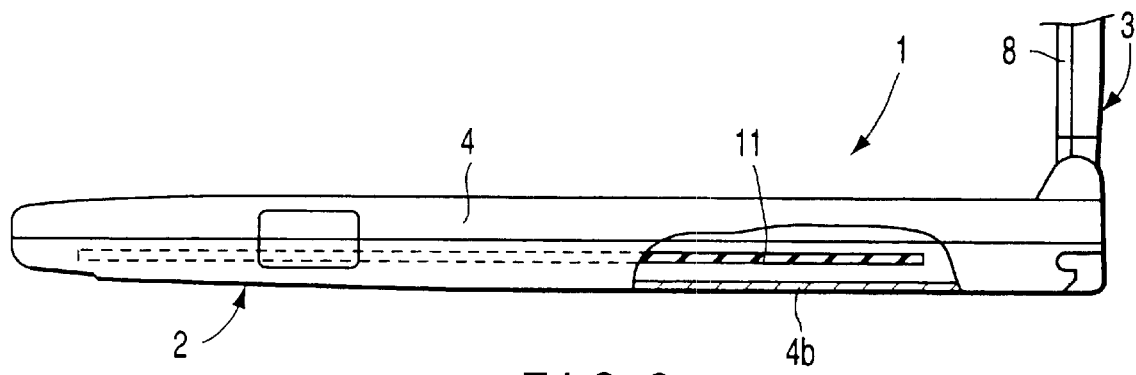
FIG. 2 is a side view illustrating the portable computer of FIG. 1 that has a housing containing a print board.

FIGS. 1 and 2 show a portable computer 1 as an electronic device. The portable computer 1 comprises a computer main body 2 and a display unit 3 pivotably supported by the computer main body 2.

The computer main body 2 has a housing 4 as an outer hull. The housing 4 is in the shape of a flat box, and incorporates a keyboard 6 on its upper surface 5. The display unit 3 includes a flat-box-shaped display housing 8, and a liquid crystal-panel 9 received in the display housing 8. A rear end portion of the housing 4 supports the display unit 3 using a hinge device (not shown). Accordingly, the display unit 3 can pivot between a closed position in which it covers the keyboard 6, and an open position in which it stands up and exposes the keyboard 6, as shown in FIG. 1.

The housing 4 contains a multilayer print board 11. The print board 11 is provided for mounting thereon an electronic device for processing high-speed signals, such as a Rambus memory, and located in the housing 4 in parallel with the bottom surface 4b of the housing 4.

As shown in FIG. 4, the multilayer print board 11 has a multilayer plate 15 that includes signal layers 12 and 13 serving as the opposite outer layers (i.e. the opposite surfaces) of the plate, and a ground layer 14 as the inner layer interposed between the signal layers. Further, respective insulation layers 16 are provided between the signal layer 12 as one surface and the ground layer 14, and between the signal layer 13 as the other surface and the ground layer 14. Thus, the signal layers 12 and 13 and the ground layer 14 are layered with the insulation layers 16 interposed therebetween.

The signal layers 12 and 13 are formed in predetermined line patterns, and the signal layers 12 and 13 includes a transmission line 17 for transmitting a high-speed signal to the surface of the multiplayer plate 15. The ground layer 14 is formed in a plain layer or a meshed pattern and arranged in parallel with the signal layers 12 and 13 in the multiplayer plate 15. In the multilayer print board 11 formed as described above, the thickness T1 of the insulation layer 16 isolating the signal layers 12 and 13, through which high-speed signals are transmitted, from the ground layer 14, and the line width W1 of the signal layers 12 and 13 are set so as to set the characteristic impedance of the signal layers 12 and 13 at a desired value.

As shown in FIGS. 3 and 4, a pad 19 serving as an electric connecting element is provided on the one surface of the multilayer plate 15. The pad 19 is to be soldered to a terminal (not shown) of the aforementioned electronic component. The pad 19 is formed rectangular and extends along the signal layer 12. Further, the pad 19 is electrically connected to the signal layer 12 at an end portion of the layer 12, and positioned at the terminal end of the transmission line 17.

The pad 19 has a width W2 necessary for soldering thereto the terminal of the electronic component and adjusted to be equal to the line width W1 of the signal layer 12. Generally, the width W2 of the pad 19 is wider than the line width W1 of the signal layer 12. Therefore, in this embodiment, the pad width W2 is reduced to a value falling within a range in which soldering can be reliably carried out, and the line width W1 of the signal layer 12 is increased, thereby making equal the line width W1 and the pad width W2. Accordingly, the transmission line 17 for transmitting high-speed signals has the same width over its entire length including the pad 19.

In the above structure, since the width W2 of the pad 19 positioned at the terminal end of the transmission line 17 is equal to the line width W1 of the signal layer 12, impedance matching can be realized between the signal layer 12 and the pad 19. Accordingly, the continuity of the characteristic impedance of the transmission line 17 does not break off at the terminal end of the transmission line 17, thereby preventing the characteristic impedance from being varied when a high-speed signal passes through the transmission line 17.

As a result, the electrical characteristics of the print board 11 and hence the stability of signal transmission are enhanced to thereby enhance the quality of signal transmission.

Although it is most preferable to make the line width W1 of the signal layer 12 and the width W2 of the pad 19 equal to each other, they may not necessarily be strictly equal to each other, but may differ by approx. 1–5%.

As shown in FIG. 5, in a high-speed signal in the 1 GHz band, there is an allowable range concerning the impedance mismatch due to a difference between the line width W1 and the pad width W2, while the Rambus memory is operating. In FIG. 5, the values in the left column indicate the differences between the line width W1 and the pad width W2, and the symbols in the right column indicate degrees of impedance matching. In the right column, "○" indicates that the memory system can operate, "Δ" indicates that the environment influences the operation of the memory system, and "X" indicates that the memory system cannot operate.

It should be noted that in the memory system, to which data in FIG. 5 is applicable, the transmission line is required to have an impedance accuracy of ±5%, and the standard circuit structure is employed except for the line width W1 and the pad width W2.

As shown in FIG. 5, if the difference between the line width W1 and the pad width W2 exceeds 10%, the memory system is inoperable. If the difference is approx. 6–9%, the environment influences its operation. It is understood from this that although it is preferable to make equal the line width W1 and the pad width W2 in order to secure stability in the operation of the memory system, a difference of, for example, approx. 1–5% falls within the allowable range for the operation of the memory system.

Second Embodiment

Figure 6:
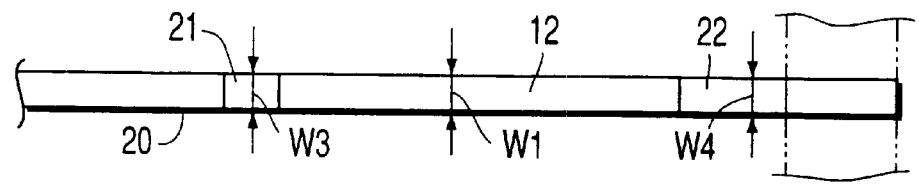
FIG. 6 is a plan view illustrating the relationship between the line width of the signal layer, the width of a test pad and the width of a connector pad.
Figure 7:
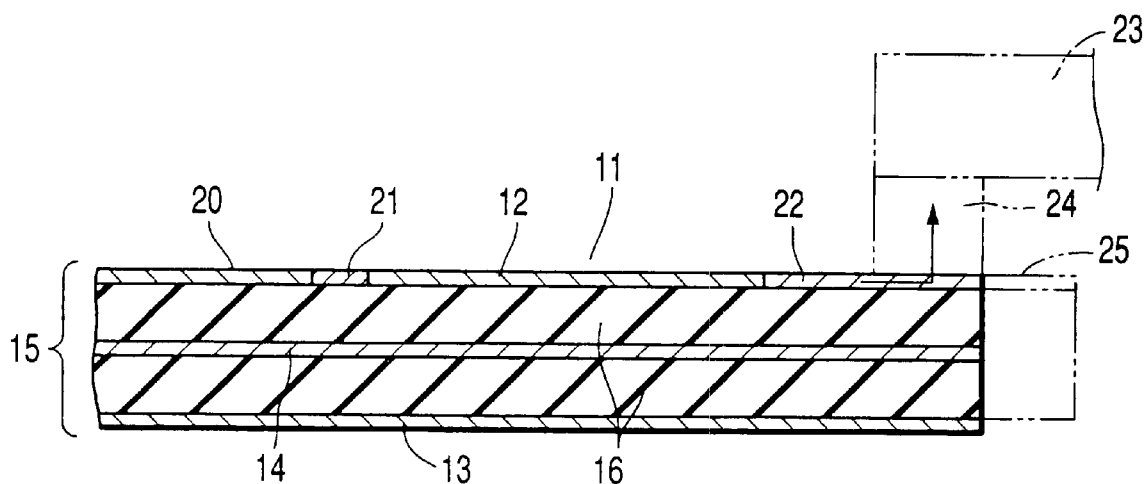
FIG. 7 is a sectional view of a multilayer print board, illustrating the positional relationship between the signal layer and the connector pad.

Referring to FIGS. 5 and 6, a second embodiment of the invention will be described.

The second embodiment mainly differs from the first embodiment in the structure of a transmission line 20. Since the basic structure of the print board 11 of the second embodiment is similar to that of the first embodiment, structural elements in the second embodiment similar to those in the first embodiment are denoted by the same reference numerals, and no explanation will be given thereof.

As shown in FIG. 6, a test pad 21 and a connector pad 22, which constitute an electrical connection, are provided on one surface of the print board 11. The test pad 21 is used to test the function of the print board 11, and located in a middle portion of the signal layer 12. The test pad 21 has a width W3 necessary for connecting a contact of a testing device. The pad width W3 is set equal to the line width W1 of the signal layer 12.

The connector pad 22 is to be soldered to a relay connector 24 used to connect the print board 11 to another print board 23. The pad 22 is formed rectangular and extends along the signal line 12. Further, the connector pad 22 has a width W4 necessary for soldering thereto the terminal of the relay connector 24 and adjusted to be equal to the line width W1 of the signal layer 12. The connector pad 22 is electrically connected to an end portion of the signal layer 12, and a point of contact between the connector pad 22 and the relay connector 24 is positioned at the terminal end of the transmission line 20.

In the above structure, since the width W3 of the test pad 21 positioned at a middle portion of the transmission line 20 is equal to the line width W1 of the signal layer 12, the continuity of the characteristic impedance of the transmission line 20 is not interrupted at its middle portion. Therefore, the test pad 21 can be provided on the middle portion of the transmission line 20 for transmitting high-speed signals, while maintaining high quality signal transmission.

Moreover, since in the above structure, the contact point of the connector pad 22 and the relay connector 24 is positioned at the terminal end of the transmission line 20, no unwanted capacitance occurs on the transmission line 20.

Specifically, if the transmission line 20 has an extended portion 25 that is extended over the contact point of the connector pad 22 and the relay connector 24 as indicated by the two-dot line, a high-speed signal (current) transmitted through the transmission line 20 is guided to another print board 23 via the relay connector 24 and not to the extended portion 25 of the line 20, as is indicated by the arrow in FIG.

7. Accordingly, the extended portion 25 remains as a capacitance loaded on the transmission line 20, and acts as a cause of interrupting the impedance continuity of the transmission line.

However, in the above structure, since the contact point of the connector pad 22 and the relay connector 24 is positioned at the terminal end of the transmission line 20, no impedance-reducing capacitance occurs at the terminal end of the transmission line 20, which means that the continuity of the characteristic impedance of the transmission line 20 is not interrupted at its terminal end. As a result, the transmission signal is stabilized and the quality of transmission can be maintained at a high level.

The present invention is not limited to the above-described embodiments, but can be modified in various ways. For example, the layer held between the insulation layers is not limited to the ground layer, but may be, for example, a power supply layer. The present invention is not limited to the multilayer print board, but may be applicable to a single-layer print board.

As described above in detail, in the invention, impedance matching can be realized between the signal layer and an electrical connection, and therefore, the continuity of the characteristic impedance of the transmission line is not interrupted, thereby preventing the characteristic impedance of the transmission line from varying when a high-speed signal is transmitted through the transmission line. As a result, the electrical characteristics of the print board and hence the stability of the signal transmission are enhanced, which means that the quality of signal transmission is enhanced.

What is claimed is:

1. A print board comprising:
   a signal layer formed in a predetermined line pattern to serve as a transmission line for transmitting high-speed signals;
   an electrical connector formed on the signal layer, connected to the transmission line, and having a width which is substantially equal to a width of the transmission line, wherein the electrical connector is positioned at a middle portion of the transmission line.

2. The print board according to claim 1, wherein the width of the transmission line is determined based on an impedance characteristic of the transmission line.

3. A print board comprising:
   a reference voltage layer;
   first and second insulation layers formed on two surfaces of the reference voltage layer;
   a first signal layer formed on the first insulation layer, formed in a predetermined line pattern to serve as a transmission line for transmitting high-speed signals;
   a second signal layer formed on the second insulation layer; and
   an electrical connector formed on the first signal layer and having a width which is substantially equal to a width of the transmission line.

4. The print board according to claim 3, wherein a difference between the width of the transmission line and the width of the electrical connector is not greater than 5%.

5. The print board according to claim 3, wherein the width of the transmission line is determined based on an impedance characteristic of the transmission line.

6. The print board according to claim 3, wherein the first insulation layer has a thickness which is determined to set a characteristic impedance of the transmission line to a desired value.

7. The print board according to claim 3, wherein the reference voltage layer comprises a power supply layer.

8. The print board according to claim 7, wherein the electrical connector comprises a pad which is positioned at a terminal end of the transmission line.

9. The print board according to claim 7, wherein the electrical connector is positioned at a middle portion of the transmission line.

10. The print board according to claim 7, wherein the electrical connector comprises a connector pad for electrically connecting with another print board, and a point of contact between the connector pad and the other print board is positioned at a terminal end of the transmission line.

11. The print board according to claim 3, wherein the reference voltage layer comprises a ground layer.

12. A print board comprising:
    a signal layer formed in a predetermined line pattern to serve as a transmission line for transmitting high-speed signals;
    an electrical connector formed on the signal layer, connected to the transmission line, and having a width which is substantially equal to a width of the transmission line, wherein a difference between the width of the transmission line and the width of the electrical connector is not greater than 5%.

13. The print board according to claim 12, wherein the width of the transmission line is determined based on an impedance characteristic of the transmission line.

14. The print board according to claim 12, wherein the electrical connector comprises a connector pad for electrically connecting with another print board, and a point of contact between the connector pad and the other print board is positioned at a terminal end of the transmission line.

15. The print board according to claim 12, wherein the electrical connector is positioned at a middle portion of the transmission line.

16. The print board according to claim 12, wherein the electrical connector comprises a pad which is positioned at a terminal end of the transmission line.

* * * * *

UNITED STATES PATENT AND TRADEMARK OFFICE
CERTIFICATE OF CORRECTION

PATENT NO. : 6,515,563 B2
DATED : February 4, 2003
INVENTOR(S) : Koga

It is certified that error appears in the above-identified patent and that said Letters Patent is hereby corrected as shown below:

Column 6,
Lines 16, 19 and 22, change "claim 7" to -- claim 3 --

Signed and Sealed this

Twenty-ninth Day of July, 2003

JAMES E. ROGAN
*Director of the United States Patent and Trademark Office*